(12) United States Patent
Babaali

(10) Patent No.: US 8,849,641 B1
(45) Date of Patent: Sep. 30, 2014

(54) ELIMINATING SPURIOUS ALGEBRAIC LOOPS

(75) Inventor: Mohamed Babaali, Framingham, MA (US)

(73) Assignee: The MathWorks, Inc., Natick, MA (US)

(*) Notice: Subject to any disclaimer, the term of this patent is extended or adjusted under 35 U.S.C. 154(b) by 724 days.

(21) Appl. No.: 13/041,900

(22) Filed: Mar. 7, 2011

(51) Int. Cl.
*G06F 7/60* (2006.01)
*G06G 7/48* (2006.01)
*G06F 17/50* (2006.01)
*G06F 9/44* (2006.01)

(52) U.S. Cl.
CPC ........ *G06F 17/5081* (2013.01); *G06F 17/5068* (2013.01)
USPC ................... 703/13; 703/2; 703/6; 703/21

(58) Field of Classification Search
None
See application file for complete search history.

(56) References Cited

U.S. PATENT DOCUMENTS

| | | | | |
|---|---|---|---|---|
| 7,337,102 | B2* | 2/2008 | Mosterman | 703/21 |
| 7,801,715 | B2* | 9/2010 | Ciolfi et al. | 703/13 |
| 7,809,545 | B2* | 10/2010 | Ciolfi et al. | 703/22 |
| 8,126,691 | B2* | 2/2012 | Ciolfi et al. | 703/13 |
| 2006/0010428 | A1* | 1/2006 | Rushby et al. | 717/124 |

OTHER PUBLICATIONS

"Stateflow and Stateflow Coder for Complex Logic and State Diagram Modeling". User's Guide Version 5. Jan. 2003.*
The MathWorks, Inc., "Simulating Dynamic Systems :: How Simulink Works (Simulink®)", 19 pages, Nov. 16, 2010 (print date).

* cited by examiner

*Primary Examiner* — Omar Fernandez Rivas
*Assistant Examiner* — Nithya J Moll
(74) *Attorney, Agent, or Firm* — Harrity & Harrity, LLP

(57) ABSTRACT

A system is configured to: identify a block of a model; represent the block as a group of sub blocks; and establish connections for the group of sub blocks. The block includes an input signal and two or more output signals. The group of sub blocks include a state block that provides a state, and two or more output blocks for receiving the state.

21 Claims, 16 Drawing Sheets

| INPUT | OUTPUTS 820 |
|---|---|
| | 1 |
| | 0 |

Inputwise DF Matrix
810

Fig. 8A

| Input 510 | Output 520 | Output 525 |
|---|---|---|
|  | 1 | 0 |

Input-Output Wise DF Matrix
820

ELIMINATING SPURIOUS ALGEBRAIC LOOPS

BACKGROUND

A block diagram may represent a system. A device may simulate the system by executing the block diagram. During execution, the device may solve an algebraic loop to determine an output signal of a block of the block diagram. In some instances, the device may also attempt to solve other algebraic loop(s) that do not actually exist (i.e., spurious algebraic loop(s)) to determine other output signal(s) of the block. As a result, the device wastes processing resources solving algebraic loops that do not actually exist.

BRIEF DESCRIPTION OF THE DRAWINGS

The accompanying drawings, which are incorporated in and constitute a part of this specification, illustrate one or more implementations described herein and, together with the description, explain these implementations. In the drawings:

FIG. 8A is an example matrix for inputwise direct feedthrough (DF);

FIG. 8B is an example matrix for input-output wise direct feedthrough (DF);

DETAILED DESCRIPTION

Figure 1:
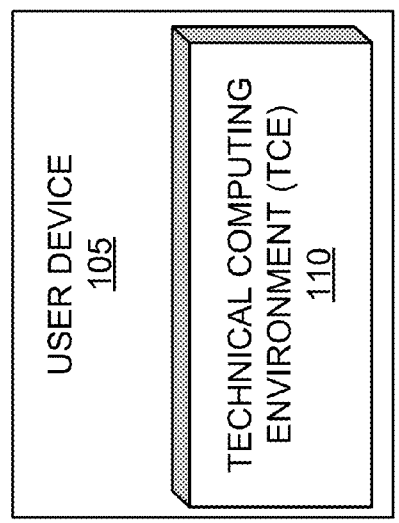
FIG. 1 is a diagram of an example environment in which systems and/or methods described herein may be implemented.

The following detailed description refers to the accompanying drawings. The same reference numbers in different drawings may identify the same or similar elements.

In a block diagram-based system, a user may interconnect blocks in a graphical user interface (GUI). The block diagram may represent a model of a dynamic system, for example, a control system or a signal processing system. Model and block diagram may be used interchangeably throughout this description. A block diagram may correspond to a representation of a model or a portion thereof.

In an implementation, a block, in the block diagram, may be represented by a number of functions specific to the block. Using object oriented terminology, these functions are often referred to as block methods. For example, in time-based diagrams in the Simulink® software application, by MathWorks, Inc., a block may represent a set of equations and may be implemented by various methods such as InitializeSizes, Start, Terminate, Outputs, Update, Derivatives, etc.

Some of the methods may be used to inform the Simulink software application (e.g., a block diagram executive) of the parameters necessary to set up the block appropriately. Examples of the parameters involved are the block's sample time, dimensions and data types of the input signals and the output signals, etc. These methods may be called during a model compilation phase, where consistency checks may be done and blocks may be sorted. In a next phase of execution, memory needed for working areas (e.g., signals, internal states, run-time parameters, etc.) may be allocated, and lists of block methods to execute may be created.

Finally, in a simulation loop phase, the block methods may execute multiple times (typically once per iteration) and the block diagram executive may successively compute the states and the output signals of the system, using information provided by the model. This phase may further be broken up into different methods, such as the outputs method and/or the update method. For example, the outputs method may calculate the output signals of a block based on the input signals and/or internal state. The update method, for example, may compute a block's internal state. It will be appreciated that this description is not intended to be a comprehensive treatment of the Simulink software application, and there may be other methods that are involved. Additionally, implementations described herein may be applicable to other block diagram-based systems which may or may not use similar semantics and/or may be compatible or incompatible with the Simulink software application.

Execution of an iteration of a model may include, for example, executing compiled or interpreted code corresponding to each block, according to the semantics of the block diagram system being utilized. In this regard, reference to blocks executing, in this description, should be broadly interpreted to mean an execution of a code (e.g., a block code) according to specified semantics of the block diagram system. In some block diagram systems, execution of an iteration may include executing one or more methods from each block. In a block diagram-based system, a block, in a block diagram, may execute in a blocking fashion. Here, a block diagram executive may instruct a block to begin execution, wait for its execution to complete, and then continue with an execution of another block. The block diagram executive often will process the output signal of the block, which completed its execution, and use that output signal as an input signal for the other block.

Technical computing environments (TCEs) provide an environment to a user, such as a scientist or an engineer, which enables the user to simulate systems, perform advanced analysis, visualize data, develop algorithms, etc. Existing TCEs may be implemented as or executed in conjunction with a graphical-based environment. For example, in one existing graphical-based TCE, models may be built by connecting graphical entities, where each entity may represent an object associated with functionality and/or data. A graphically-based TCE may be used to represent and simulate a block diagram-based system.

A user may include a block, in a block diagram, that receives an input signal, provides one or more output signals, and utilizes one or more equations. A block may have direct feedthrough when an output signal directly depends on an input signal. The term, directly depends, may refer to an output signal depending on an input signal of a block in a manner that does not involve delays, such as integration. For example, assume a block is a multiplication block that multiplies an input signal X by 2 to obtain an output signal Y. Thus, in this situation, the block may be determined to have direct feedthrough since the output signal Y (representing 2X) directly depends from input signal X. Accordingly, directly affects may be used to describe a situation where an input signal directly affects an output signal when the output signal directly depends on the input signal.

An algebraic loop may form when direct feedthrough is present in a model. Conventionally, when the block has direct feedthrough, the block is processed as though direct feedthrough exists between each one of the output signals of the block and the input signal of the block. As a result, the block processing assumes that each one of the output signals directly depend on the input signal even when that is not the case. Due to the incorrect assumption(s), the block processing may attempt to solve algebraic loops in association with all of the output signals of the block (e.g., to calculate values for the output signals), including proceeding to solve spurious algebraic loops for those output signals that do not directly depend on the input signal. Significant processing resources can be wasted solving (or, attempting to solve) spurious algebraic loop(s) that do not need to be solved.

A spurious algebraic loop may refer to an algebraic loop that a computing environment incorrectly assumes exists and proceeds to solve. A spurious algebraic loop is associated with an output signal of a block that does not directly depend on an input signal. The computing environment may attempt to solve the spurious algebraic loop, via numerous iterations, in the way that computing environment solves actual algebraic loops.

Overview

An implementation, described herein, may eliminate spurious algebraic loops. An original block of a model may have an input signal and two or more output signals. At least one of the output signals may directly depend on the input signal and another one of the output signals may not directly depend on the input signal. Because at least one of the output signals directly depends on the input signal, a TCE may determine that the original block has direct feedthrough (DF). A spurious algebraic loop may exist because one of the output signals does not directly depend on the input signal.

The TCE may replace the original block with a group of sub blocks to eliminate the spurious algebraic loop. The group of sub blocks may include a state block and two or more output blocks. Each one of the two or more output blocks may correspond to one of the two or more output signals. In some situations, the TCE may optimize the group of sub blocks by combining two or more of the output blocks into a single sub block. Combining output blocks into a single sub block may refer to combining input signals, output signals, and output equations of the output blocks in the single sub block (e.g., by eliminating duplicate input signals). The TCE may establish connections between the group of sub blocks. The TCE may use, for the model, the group of sub blocks instead of the original block.

Example Environment

FIG. 1 illustrates an example environment 100 in which systems and/or methods described herein may be implemented. As illustrated, environment 100 may include a user device 105 that includes a technical computing environment (TCE) 110.

User device 105 may include a computational device. For example, user device 105 may include a server, a workstation, a mainframe, a computer (e.g., a desktop computer, a laptop computer, etc.) and/or some other type of computational device.

TCE 110 may include hardware-based logic and/or a combination of hardware and software-based logic that provides a computing environment. The computing environment may permit a user to perform tasks related to disciplines, such as, but not limited to, mathematics, science, engineering, medicine, business, etc.

TCE 110 may include a dynamically typed language (e.g., a dynamically typed programming language) that can be used to express problems and/or solutions in mathematical notations familiar to those of skill in the relevant arts. For example, TCE 110 may use an array as a basic element, where the array may not require dimensioning. In addition, TCE 110 may perform matrix and/or vector formulations that can be used for data analysis, data visualization, application development, simulation, modeling, algorithm development, etc. These matrix and/or vector formulations may be used in many areas, such as statistics, finance, image processing, signal processing, control design, life sciences, education, discrete event analysis and/or design, state based analysis and/or design, etc.

TCE 110 may further provide mathematical functions and/or graphical tools (e.g., for creating plots, surfaces, images, volumetric representations, etc.). In an implementation, TCE 110 may provide these functions and/or tools using toolboxes (e.g., toolboxes for signal processing, image processing, data plotting, parallel processing, etc.). In other implementations, TCE 110 may provide these functions as block sets. In still other implementations, TCE 110 may provide these functions in another way, such as via a library, etc.

TCE 110 may include a user interface for creating, compiling, executing, analyzing, validating, etc., a model of a system. TCE 110 may provide one or more environments for modeling the system. For example, TCE 110 may include a graphical-based environment, a textual-based environment, and/or a hybrid environment (e.g., a combination of graphical and textual environments). TCE 110 may connect, access, and/or interface with other software applications, data, devices, and/or other types of resources during a modeling process.

Example User Device

Figure 2:
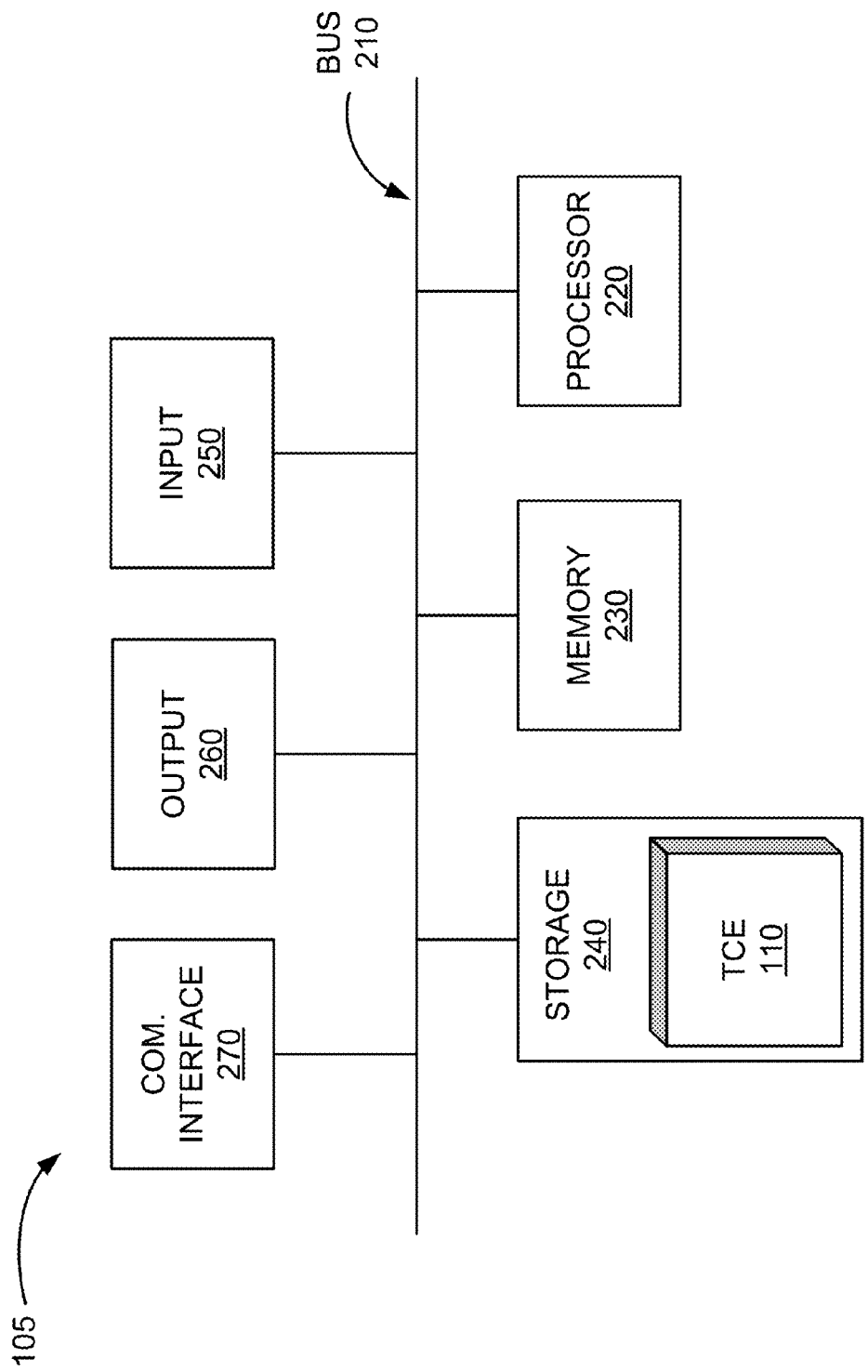
FIG. 2 is a diagram of example components of a user device of FIG. 1.

FIG. 2 is a diagram of example components of user device 105. As shown in FIG. 2, user device 105 may include a bus 210, a processor 220, a memory 230, storage 240, an input 250, an output 260, and/or a communication interface 270. In other implementations, user device 105 may include fewer, additional, and/or different components, and/or a different arrangement of components than those depicted in FIG. 2. Additionally, or alternatively, one or more components of user device 105 may perform one or more acts described as being performed by one or more other components of user device 105.

Bus 210 may permit communication among the other components of user device 105. For example, bus 210 may include a system bus, an address bus, a data bus, and/or a control bus. Bus 210 may also include bus drivers, bus arbiters, bus interfaces, and/or clocks.

Processor 220 may interpret and/or execute instructions. For example, processor 220 may include one or more general-purpose processors, microprocessors, data processors, graphical processing units (GPUs), co-processors, network processors, application specific integrated circuits (ASICs), application specific instruction-set processors (ASIPs), system-on-chips (SOCs), controllers, programmable logic devices (PLDs), chipsets, and/or field programmable gate arrays (FPGAs).

Memory 230 may store data and/or instructions related to the operation and use of user device 105. For example, memory 230 may store data and/or instructions that may be configured to implement one or more implementations described herein. Memory 230 may include, for example, a random access memory (RAM), a dynamic random access memory (DRAM), a static random access memory (SRAM), a synchronous dynamic random access memory (SDRAM), a ferroelectric random access memory (FRAM), a read only memory (ROM), a programmable read only memory (PROM), an erasable programmable read only memory (EPROM), an electrically erasable programmable read only memory (EEPROM), and/or a flash memory.

Storage 240 may store data and/or software related to the operation and use of user device 105. For example, storage 240 may include a hard disk (e.g., a magnetic disk, an optical disk, a magneto-optic disk, a solid state disk), a compact disc (CD), a digital versatile disc (DVD), a floppy disk, a cartridge, a magnetic tape, and/or another type of computer-readable medium, along with a corresponding drive. Memory 230 and/or storage 240 may also include a storing device external to and/or removable from user device 105, such as a Universal Serial Bus (USB) memory stick, a hard disk, etc. In an implementation, as illustrated, storage 240 may store TCE 110.

Input 250 may permit the user and/or another device to input information into user device 105. For example, input 250 may include a keyboard, a keypad, a mouse, a display (e.g., a touch screen), a button, a switch, a microphone, voice recognition logic, an input port, and/or some other type of input component. Output 260 may permit user device 105 to output information to the user and/or another device. For example, output 260 may include a display, a speaker, one or more light emitting diodes (LEDs), an output port, and/or some other type of output component.

Communication interface 270 may permit user device 105 to communicate with other devices, networks, and/or systems. Communication interface 270 may include a transceiver-like component. For example, communication interface 270 may include an Ethernet interface, an optical interface, a coaxial interface, a radio interface, and/or some other type of wireless and/or wired interface.

As will be described in detail below, user device 105 may perform certain operations relating to implementations described herein. User device 105 may perform these operations in response to processor 220 executing software instructions (e.g., computer program(s)) contained in a computer-readable medium, such as memory 230 and/or storage 240. A computer-readable medium may be defined as a non-transitory memory device. A memory device may include space within a single physical memory device or spread across multiple physical memory devices. The software instructions may be read into memory 230 from another computer-readable medium, such as storage 240, or from another device via communication interface 270. The software instructions contained in memory 230 may cause processor 220 to perform processes described herein. Alternatively, hardwired circuitry may be used in place of or in combination with software instructions to implement processes described herein. Thus, implementations described herein are not limited to any specific combination of hardware circuitry and software.

Example Technical Computing Environment

Figure 3:
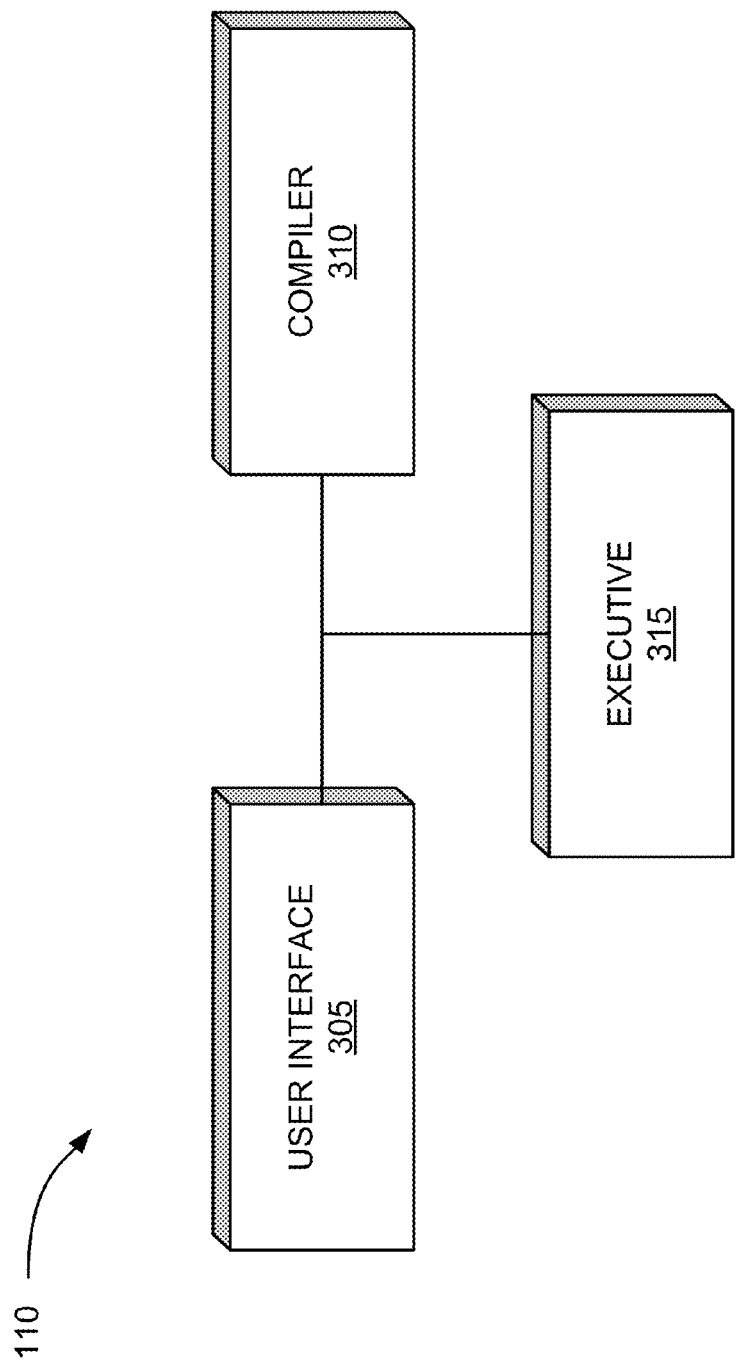
FIG. 3 is a diagram illustrating example functional components of a technical computing environment (TCE)

FIG. 3 is a diagram illustrating example functional components of TCE 110. TCE 110 may include, for example, a user interface 305, a compiler 310, and an executive 315. In other implementations, TCE 110 may include fewer, additional and/or different functional components, and/or a different arrangement of functional components than those illustrated in FIG. 3. The functions described in connection with FIG. 3 may be performed by one or more of the components of user device 105 depicted in FIG. 2.

User interface 305 may include logic to provide one or more interfaces that aid a user in creating, compiling, executing, and/or analyzing a model of a system. User interface 305 may provide libraries that include predefined entities that may be used to create the model. Additionally, or alternatively, user interface 305 may permit user-defined entities to be created and used when creating the model. For example, user interface 305 may include predefined blocks and/or permit user-defined blocks to be created and used when creating the model of the system.

Compiler 310 may include logic to provide a transformation of information associated with the model to an alternative form. For example, compiler 310 may convert the model into an internal representation that allows the block diagram executive to execute the model represented by the block diagram in an interpreted mode. In particular, compiler 310 may convert the graphical description embodied by the block diagram into an internal form, allocate data structures for the memory, generate an order of execution, and then execute the pre-written versions of the blocks in the block diagram. Compiler 310 may also convert the model into an internal representation which then allows the generation of code which may then be executed in another executable environment.

For example, compiler 310 may generate code (e.g., executable code, target code, intermediate code, etc.) that corresponds to the model. The code may be generated as a textual language (e.g. C/C++) which will then be further compiled and linked into an executable program directly executable by an operating system, including, but not limited to, an operating system on which TCE 110 may be running. For example, compiler 310 may transform the model into generated code in the form of a hardware description language, which can be used to synthesize custom hardware.

Compiler 310 may perform various operations to generate the code. For example, compiler 310 may prepare data structures, evaluate parameters, configure and propagate entity characteristics, determine entity connectivity, determine signal compatibility, etc., associated with the model. In one implementation, compiler 310 may convert the model into an executable form, which may be executed. In other implementations, compiler 310 may generate an internal representation of the model for execution in an interpreted mode, and/or compiler 310 may generate textual code for further execution in another environment.

The executable form of the model may include, for example, an executable image, object code, a library, and/or some other form. The executable form of the model may also include code generated in a textual language that is not executable directly by the operating system (e.g., of TCE 110), but runs in another environment (e.g., Java, Perl, MATLAB code, or other interpreted languages). Compiler 310 may permit the user to select a target platform for the generated executable code.

Executive 315 may include logic to execute, run, and/or simulate the executable form of the model and output a result of the executed model.

In other implementations, TCE 110 may also import and/or access a stored model that was created in another environment, such as, but not limited to, another TCE 110. The imported and/or stored model may then be compiled, executed, etc. For example, the Real-Time Workshop® software application by MathWorks, Inc. may generate and execute C and C++ code for models created in the Simulink software application, also by MathWorks, Inc.

Example Model

Figure 4:
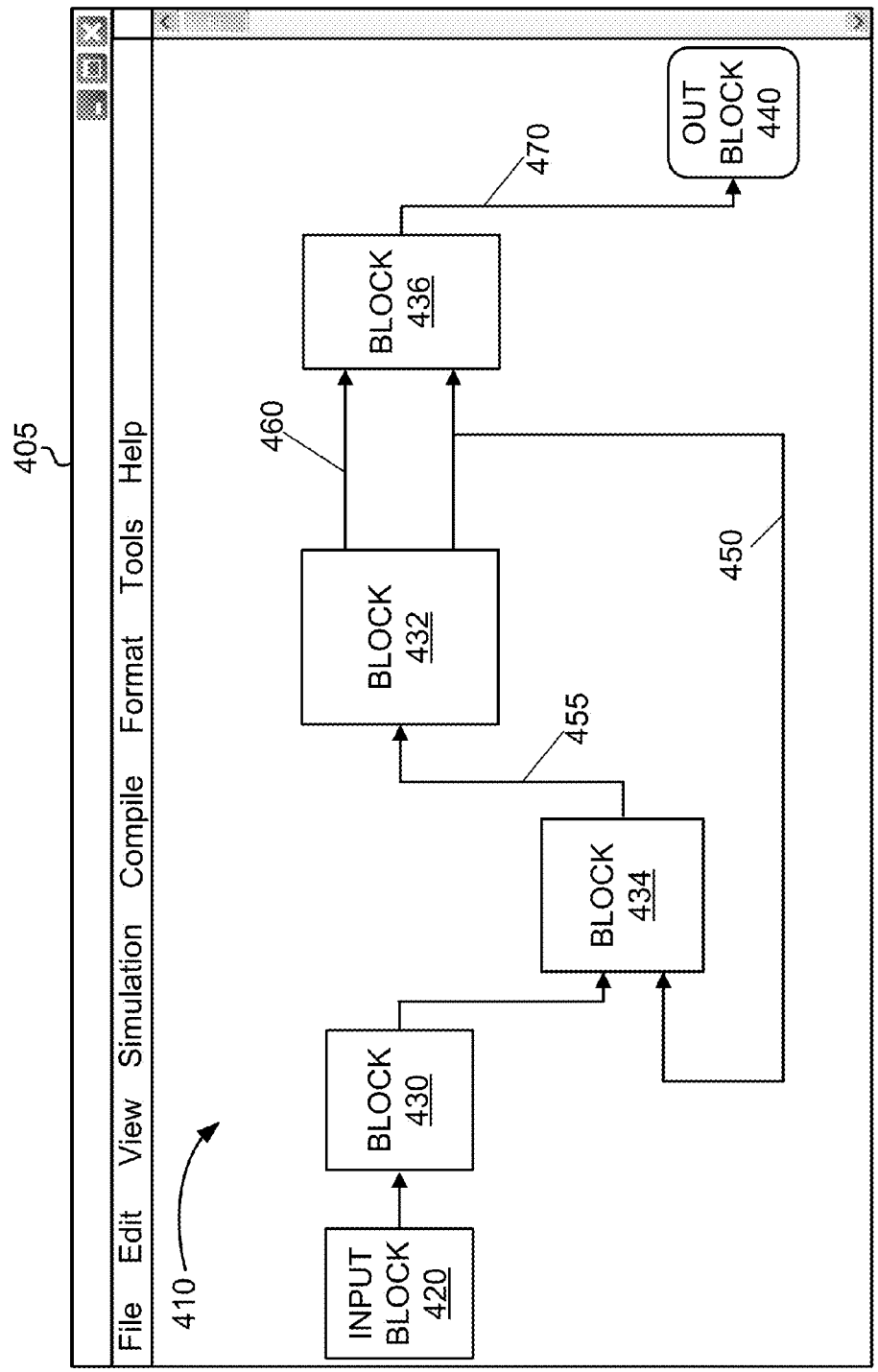
FIG. 4 is a diagram illustrating an example model in an example graphical user interface.

FIG. 4 is a diagram illustrating an example model 410 in an example graphical user interface (GUI) 405. User interface 305 may provide GUI 405 in which a user may create model 410. Model 410 may include an input block 420, a block 430, a block 432, a block 434, block 436, and an out block 440. Model 410 is provided for explanatory purposes only. In practice, model 410 may include more blocks, fewer blocks, different blocks, and/or differently arranged blocks. Also, model 410 may include different connections between blocks. Additionally, or alternatively, although model 410 is represented as a graphical block diagram, depending on the environment, model 410 may be represented with textual representation, hybrid representation, etc.

Input block 420 may represent any block that provides an input signal to model 410 and/or drives block 430 to execute. For example, input block 420 may execute and directly or indirectly cause block 430 to execute, by providing the input signal to block 430. Each one of block 430, block 432, block 434, and/or block 436 may include any block that represents an operation associated with a variable (e.g., an input signal, an output signal). Each one of block 430, block 432, block 434, and/or block 436 may represent, for example, a computation block, a communication block, etc.

For example, block 430 may receive an input signal from input block 420. Block 430 may determine an output signal based on the input signal. Block 430 may provide the output signal to block 434. Block 434 may receive the output signal from block 430 as a first input signal. Block 434 may query block 432 to receive a second input signal. In response to the query, block 432 may provide, via a signal line 450, an output signal to block 434, as the second input signal.

Block 432 may receive, via a signal line 455, the input signal from block 434. Block 432 may include a state equation to determine a state based on the input signal. Block 432 may further include a first output equation to determine the first output signal based on the state equation and/or the input signal received by block 432. In FIG. 4, the first output signal may be provided to block 436 via signal line 450. Block 432 may also include a second output equation to determine a second output signal based on the state equation and/or the input signal received by block 432. In FIG. 4, the second output signal may be provided to block 436 via signal line 460. Assume that block 432 has direct feedthrough because, for example, a first output signal of block 432 directly depends on the input signal of block 432. However, assume that a second output signal of block 432 does not directly depend on an input signal of block 432. Accordingly, a (spurious) algebraic loop may occur between blocks 432 and 434 via signal lines 450 and 455.

Block 436 may receive the first output signal, as a first input signal, and the second output signal, as a second input signal, from block 432. Block 436 may determine a third output signal based on the first input signal and the second input signal. Out block 440 may receive the third output signal from block 436 via signal line 470. In response, out block 440 may transmit the third output signal to another model, a storage medium, and/or a destination device. In another implementation, out block 440 may generate a representation based on the output signal.

Example Solution for Eliminating a Spurious Algebraic Loop

Figure 5:
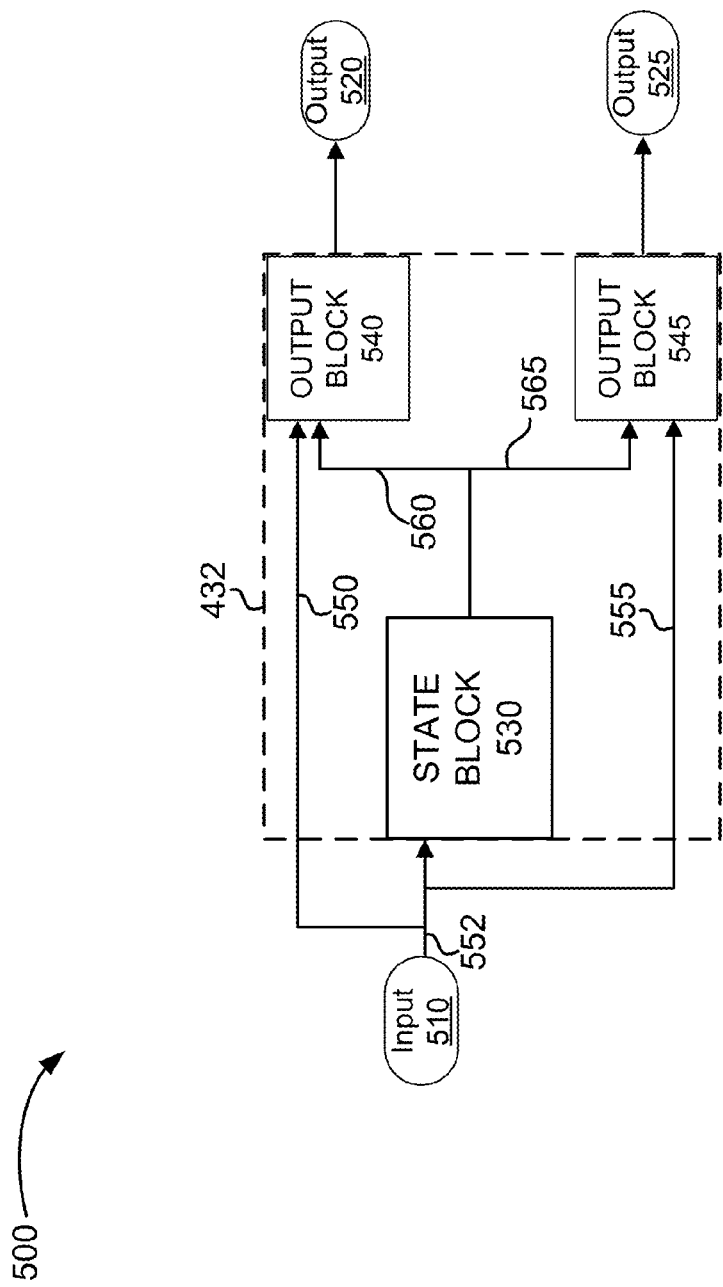
FIG. 5 is a block diagram of an example solution for eliminating a spurious algebraic loop.

FIG. 5 is a block diagram 500 of an example solution for eliminating a spurious algebraic loop. Block 432, of model 410, may receive an input signal 510 (e.g., via signal line 455) and provide an output signal 520 and an output signal 525. Each one of input signal 510, output signal 520, and/or output signal 525 may represent one of a scalar, a matrix, a vector, a dynamic data structure, a multidimensional data structure, etc. Here, block 432 may include a state equation, a first output equation to determine output signal 520, and a second output equation to determine output signal 525. Assume that block 432 has direct feedthrough because output signal 520 directly depends on input signal 510. For purposes of discussion in connection with FIG. 5, assume that output signal 525 does not directly depend on input signal 510.

Conventionally, a block diagram 500 is processed as though output signal 525 also directly depends on input signal 510, even though that is not the case. Accordingly, conventionally, an algebraic loop for output signal 520 is solved, which wastes processing power by attempting to solve a spurious algebraic loop for output signal 525.

Implementations described herein may eliminate a spurious algebraic loop by representing block 432 using a group of sub blocks. For example, TCE 110 may determine that block 432 has direct feedthrough. In response, TCE 110 may represent block 432, in an expanded manner, using the group of sub blocks. The group of sub blocks may include a state block 530, an output block 540, and an output block 545.

State block 530 may receive input signal 510 and determine a state by using the state equation of block 432. Each one of output block 540 and output block 545 may receive input signal 510 and, from state block 530, the state. Output block 540 may determine, based on input signal 510 and/or the state, output signal 520 by using the first output equation. Output block 545 may determine, based on input signal 510 and/or the state, output signal 525 by using the second output equation.

TCE 110 may connect the group of sub blocks with signal lines to provide input signal 510 and/or the state to one or more sub blocks of the group of sub blocks. For example, the signal lines may include input connections 550, 552, and 555. Input connection 550 may provide input signal 510 to output block 540. Input connection 552 may provide input signal 510 to state block 530. Input connection 555 may provide input signal 510 to output block 545. The signal lines may also include state connections 560 and 565. State connection 560 may provide the state from state block 530 to output block 540. State connection 565 may provide the state from state block 530 to output block 545. The group of sub blocks can eliminate spurious algebraic loops associated with output block 545.

Example Solution for Eliminating Spurious Algebraic Loops

Figure 6A:
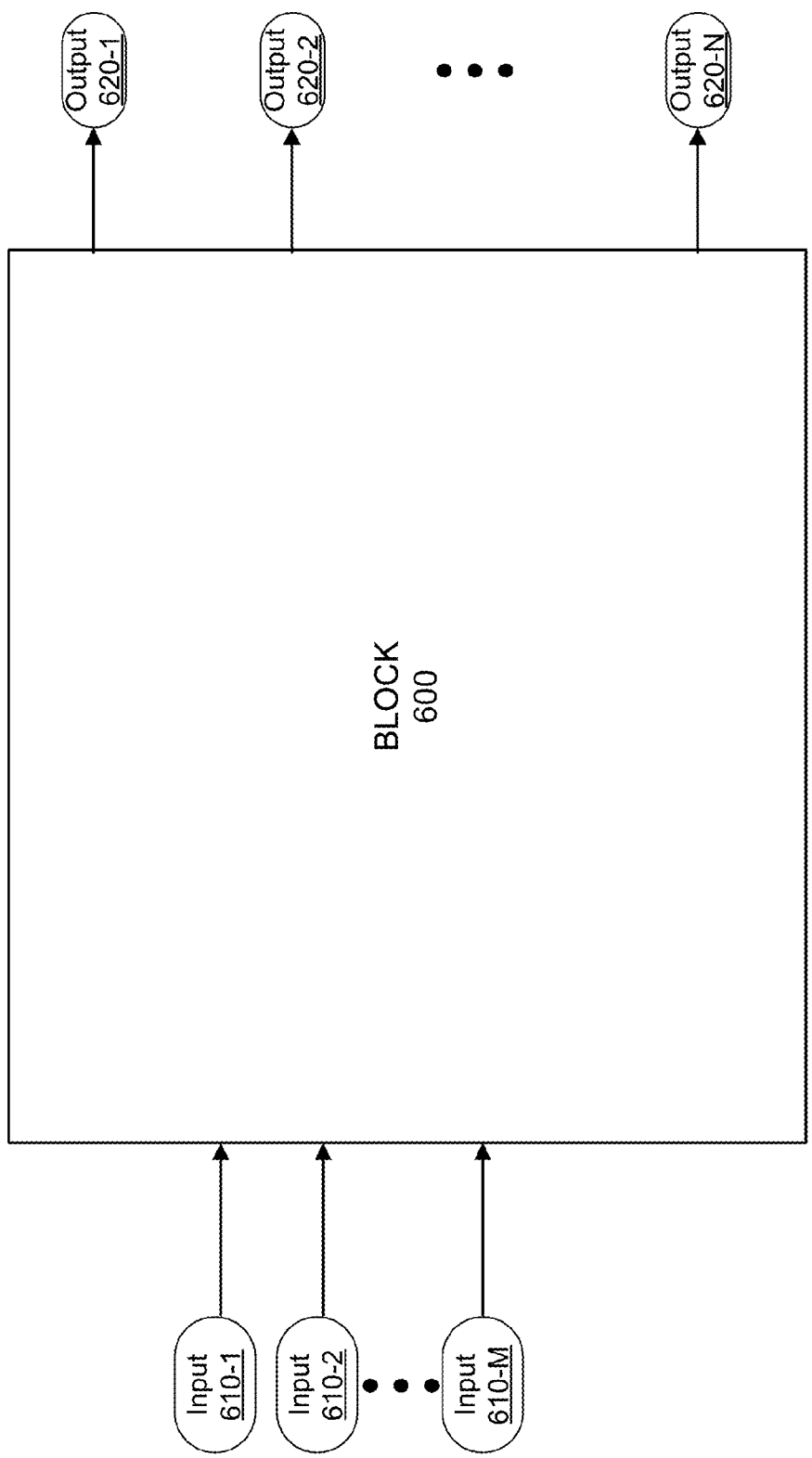
FIGS. 6A and 6B are example block diagrams illustrating an example solution for eliminating spurious algebraic loops for a block having multiple inputs and multiple outputs.

FIG. 6A is a diagram illustrating an example block 600, of a model, having multiple input signals and multiple output signals. Assume that block 600 receives input signals 610-1, 610-2, ..., 610-M (collectively referred to as "input signals 610" and individually as "input signal 610"). Further assume that block 600 provides output signals 620-1, 620-2, ..., 620-N (collectively referred to as "output signals 620" and individually as "output signal 620"). Each one of input signals 610 and/or output signals 620 may represent a scalar, a matrix, a vector, a dynamic data structure, a multidimensional data structure, etc.

Block 600 may include a state equation. For example, the following equation may represent a state equation: $O=f(l, x, u_1, u_2, \ldots, u_m)_\square$, where:
- $f$ may correspond to a differential-algebraic equation specifying the state equation,
- x may correspond to the multi-dimensional state, and
- $u_1, u_2, \ldots, u_m$ may correspond to input signals 610.

In addition, block 600 may include variables corresponding to outputs 620 of block 600, such as: $y_1, y_2, \ldots, y_m$. Block 600 may also include a first output equation (e.g., $y_1=(x, u_1, u_2, \ldots, u_m)_\square$) to calculate output 620-1 (e.g., $y_1 1$), a second output equation (e.g., $y_2=g_2(x, u_1, u_2, \ldots, u_m)$) to calculate output 620-2 (e.g., $y_1 2$), etc.

Assume for sake of example, some of output signals 620 directly depend on one of input signals 610 (e.g., input signal 610-1). Further assume that at least one output signal 620 (e.g., output signal 620-2) does not directly depend on input signal 610-1. In a conventional implementation, TCE 110 may solve a spurious algebraic loop for output signal 620-2.

Figure 6B:
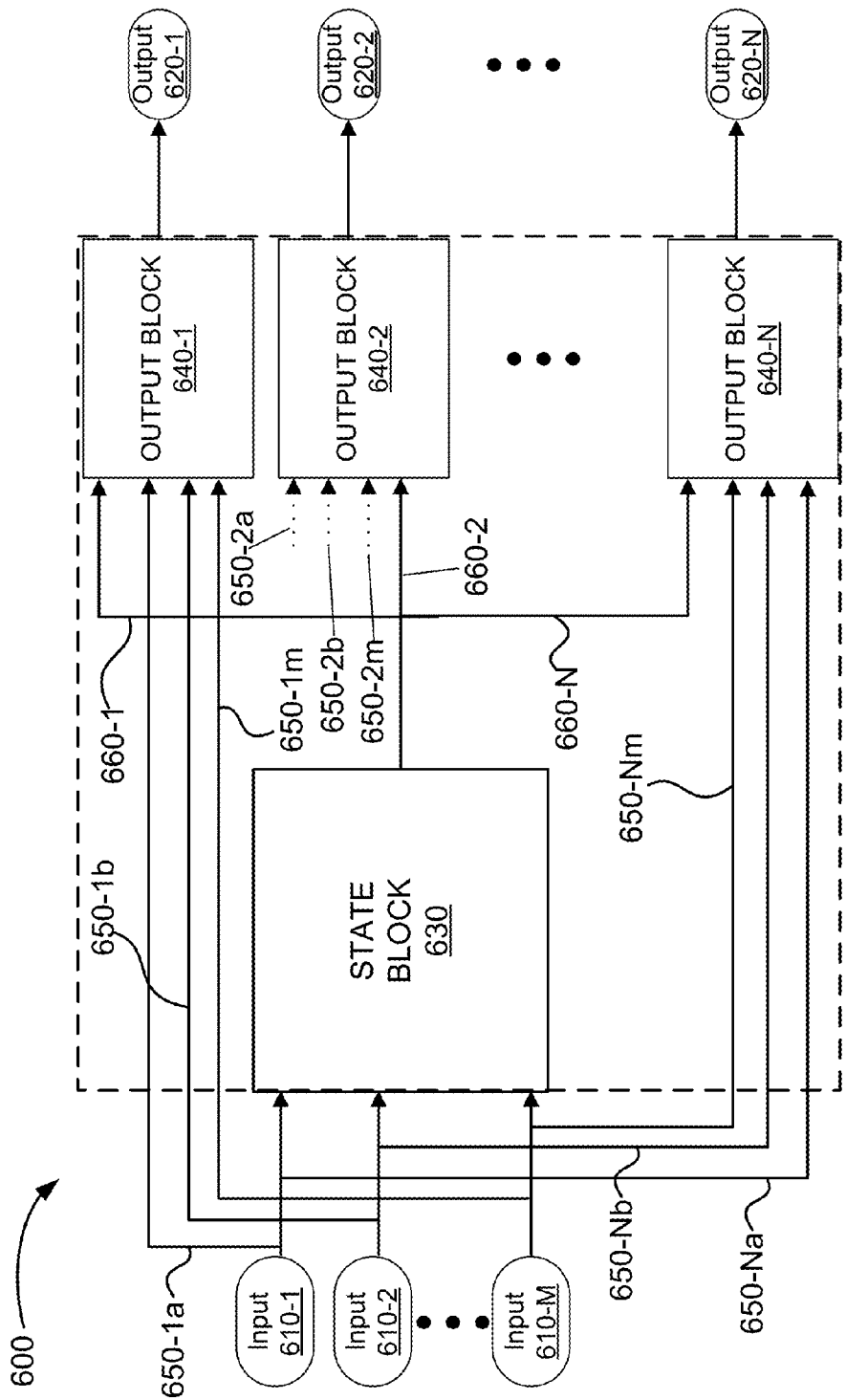

FIG. 6B illustrates an example solution for eliminating spurious algebraic loops encountered when using conventional TCE implementations of block 600. For example and using an implementation of the invention, TCE 110 may represent block 600 as a group of sub blocks to eliminate spurious algebraic loops associated with block 600. In one implementation, a quantity of the sub blocks in the group of sub blocks (e.g., N+1) may equal a quantity of outputs 610 (e.g., N) plus a quantity of state equations (e.g., 1). Thus, for example, if block 430-2 includes 8 outputs 620, TCE 110 may represent block 600 with 9 different sub blocks in the group of sub blocks.

Here, as shown in FIG. 6B, the group of sub blocks may include a state block 630 and output blocks 640-1, 640-2, ..., 640-N (collectively referred to as "output blocks 640" and individually as "output block 640"). State block 630 may include the state equation (e.g., $[O=f(x', x, u_1 1, u_1 2, \ldots, u_1 m)]_k$). Each one of output blocks 640 may correspond to a different one of output signals 620. For example, output block 640-1 may correspond to output signal 620-1, output block 640-2 may correspond to output signal 620-2, ..., and output block 640-N may correspond to output signal 620-N. Each output block 640 may include an output equation (e.g. $y_1=g_1(x, u_1, u_2, \ldots, u_m)_\square$), originally included in block 600, for determining the corresponding output signal 620 (e.g., output signal 620-1).

TCE 110 may connect the group of sub blocks, which are used to represent block 600, with signal lines. As shown in FIG. 6B, the signal lines may include input connections 650-1a, 650-2a, ..., 650-Na, 650-1b, 650-2b, ..., 650-Nb, ..., 650-1m, 650-2m, 650-Nm (collectively referred to as "input connections 650"). The signal lines may also include state connections 660-1, 660-2, ..., 660-N (collectively referred to as "state connections 660").

Input connections 650 may provide each one of input signals 610 to each one of output blocks 640. To do so, input connections 650 may connect each one of input signals 610 to each one of output blocks 640. For example, input connections 650 may connect input signal 610-1 to output block 640-1 with input connection 650-1a, to output block 640-2 with input connection 650-2a, ..., and to output block 640-N with input connection 650-Na.

State connections 660 may provide a state to one or more of output blocks 640. To do so, state connections 660 may connect state block 630 to one or more of output blocks 640. For example, state connection 660-1 may connect state block 630 to output block 640-1, state connection 660-2 may connect state block 630 to output block 640-2, ..., and state connection 660-N may connect state block 630 to output block 640-N. TCE 110 may use the group of sub blocks (i.e., sub blocks 630 and 640) with input connections 650 and state connections 660 instead of using block 600.

Example Process for Eliminating Spurious Algebraic Loops

Figure 7:
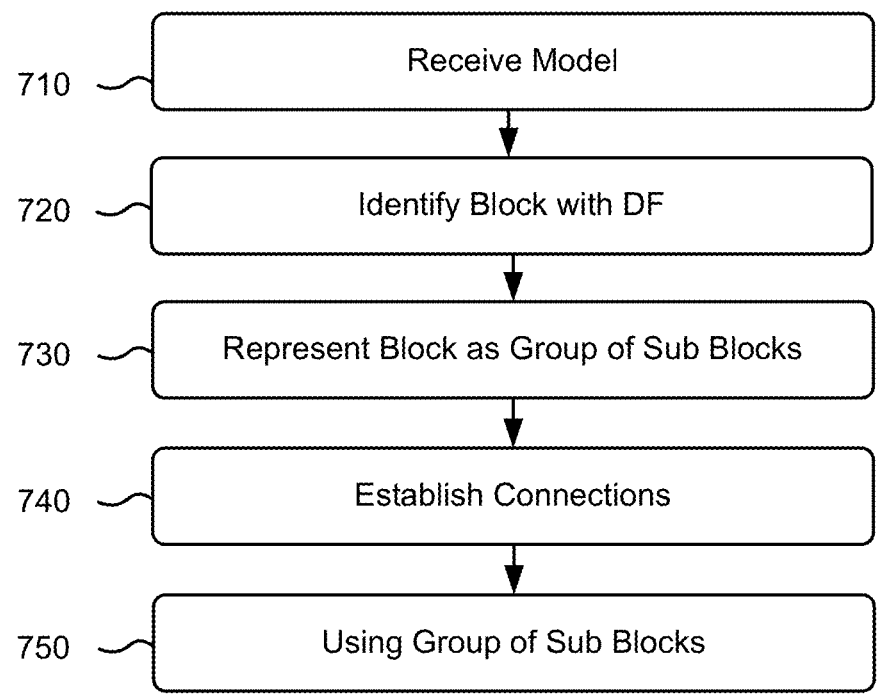
FIG. 7 is a flowchart of an example process for eliminating spurious algebraic loops.

FIG. 7 is a flowchart of an example process 700 for eliminating spurious algebraic loops. TCE 110 may perform process 700. Process 700 is described with reference to FIG. 5.

Process 700 may include receiving a model (block 710). For example, a user may use TCE 110 to create a model or retrieve a model from a storage location. TCE 110 may receive the model to compile and execute code representing the model.

Process 700 may further include identifying a block with direct feedthrough (DF) (block 720). For example, TCE 110 may inspect the model to determine what blocks in the model have direct feedthrough. Assume, for explanatory purposes, that the model includes block 432. In one implementation, block 432 may include a flag that indicates that block 432 has direct feedthrough. Specifically, the flag may indicate that, for example, output signal 520 directly depends on input signal 510 (or, alternatively, the flag may indicate that input signal 510 directly affects output signal 520). TCE 110 may use the flag to identify that block 432 has direct feedthrough.

In another implementation, TCE 110 may perform automatic analysis based on state equation(s) and output equation(s) associated with block 432 to determine whether one of output signal 520 or output signal 525 directly depends on input signal 510. For example, TCE 110 may determine, based on one or more of the equations associated with block 432, that output signal 520 directly depends on input signal 510. Based on the determination, TCE 110 may identify block 432 as having direct feedthrough.

Process 700 may also include representing a block as a group of sub blocks (block 730). For example, TCE 110 may create a quantity of blocks that equals one more than the quantity of output signals of the block. TCE 110 may create the sub blocks in response to identifying that block 432 has direct feedthrough. With reference to FIG. 5, for example, TCE 110 may create a group of sub blocks that includes state block 530, output block 540, and output block 545. TCE 110 may generate state block 530 as corresponding to the state equation of block 432. TCE 110 may generate block 540 as corresponding to an output equation of block 432 for determining output signal 520. TCE 110 may generate block 545 as corresponding to an output equation of block 432 for determining output signal 525. TCE 110 may display a representation of the group of sub blocks, instead of block 432, to the user.

Process 700 may also include establishing connections (block 740). For example, TCE 110 may connect each input signal, associated with the block, with each output block and connect the state block with each output block. With reference to FIG. 5, for example, TCE 110 may establish input connection 550 from input signal 510 to output block 540, input connection 552 from input signal 510 to state block 530, and input connection 555 from input signal 510 to output block 545. TCE 110 may also establish state connection 560 from state block 530 to output blocks 540 and state connection 565 from state block 530 to output block 545.

In another implementation, TCE 110 may determine what connections are to be established based on the output equations associated with output blocks 540 and 545. Based on the determination(s), TCE 110 may establish one, two, or all three of input connections 550, 552, or 555. Further based on the determinations, TCE 110 may establish state connection 560 and/or state connection 565. For example, TCE 110 may not establish state connection 560 when the state is not utilized by output block 540 to calculate output 520.

Process 700 may also include using a group of sub blocks (block 750). For example, after the group of sub blocks is created and the connections are established, TCE 110 may use the group of sub blocks by compiling and executing the group of sub blocks, instead of block 432. TCE 110 may compile and execute (code based on) the group of sub blocks in order to execute the model. In another implementation, using the group of sub blocks may include representing the group of sub blocks, instead of block 432, in a visual representation of the model. The user may make modifications to the model based on the visual representation.

Example Inputwise Matrix

FIG. 8A is an example inputwise direct feedthrough (DF) matrix 810 (herein, matrix 810). Conventionally, a block having direct feedthrough may be treated as though the block has inputwise DF. For example, matrix 810 illustrates the relationships between an input signal and output signals of a block that has inputwise DF. Column 820 of matrix 810 corresponds to all the output signals. As shown in matrix 810, a "1" indicates that the corresponding output signal directly depends on the input signal and a "0" indicates that the corresponding output signal does not directly depend on the input signal.

With inputwise DF, if the input signal directly affects any one of the output signals, the computing environment acts as though each one of the output signals directly depends on the input signal even when one or more of the output signals do not directly depend on the input signal. Therefore, for inputwise DF, matrix 810 does not account for which particular output signal(s) depend on the input signal. As a result, the computing environment proceeds to solve spurious algebraic loops for the one or more output signals that do not directly depend on the input signal because the computing environment acts as though direct feedthrough exists between the input signal and all the output signals.

Example Input-Output Wise Matrix

FIG. 8B is an example input-output wise direct feedthrough (DF) matrix 820 (herein, matrix 820). In an implementation, described herein, TCE 110 may create matrix 820 for block 432 (FIG. 5) that has direct feedthrough. Matrix 820 may show a relationship between input signal 510 and each one of output signals 520 and 525. A first column of matrix 820 may correspond to output signal 520. A second column of matrix 820 may correspond to output signal 525. As shown, matrix 820 indicates, for example, that output signal 520 directly depends on input signal 510, and that output signal 525 does not directly depend on input signal 510. When block 432 is represented using a group of blocks, TCE 110 may only solve an algebraic loop based on the direct feedthrough relationship that exists between input signal 510 and output signal 520. Furthermore, TCE 110 may not attempt to solve any spurious algebraic loops as long as input signal 510 does not have direct feedthrough with the state (i.e., as long as state block 530 has no direct feedthrough), which is the case when the state equation of state block 530 is an ordinary differential equation.

Example of Creating and Optimizing a Group of Sub Blocks

Figure 9A:
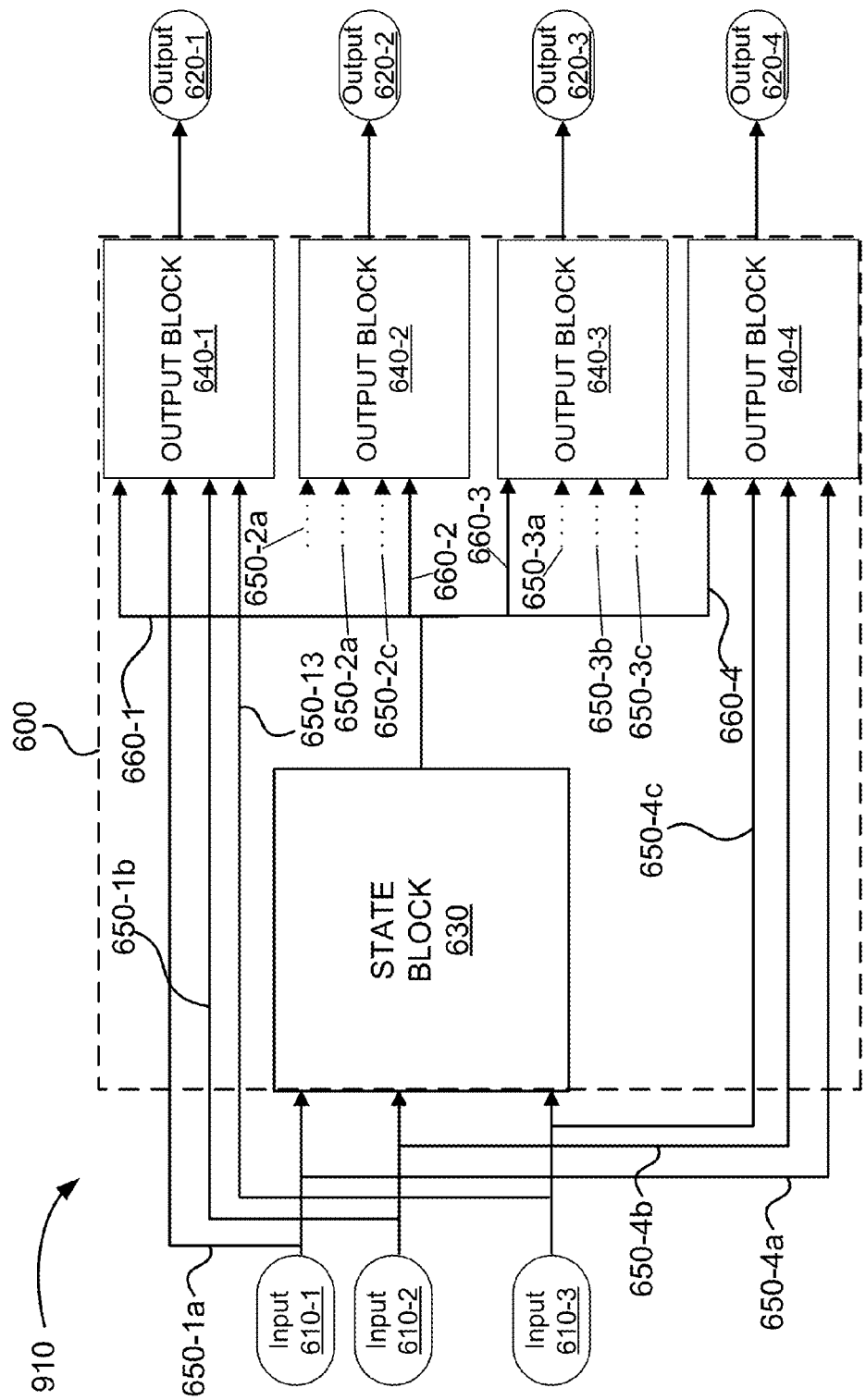
FIGS. 9A and 9B are example block diagrams illustrating an example of creating and optimizing a group of sub blocks.
Figure 9B:
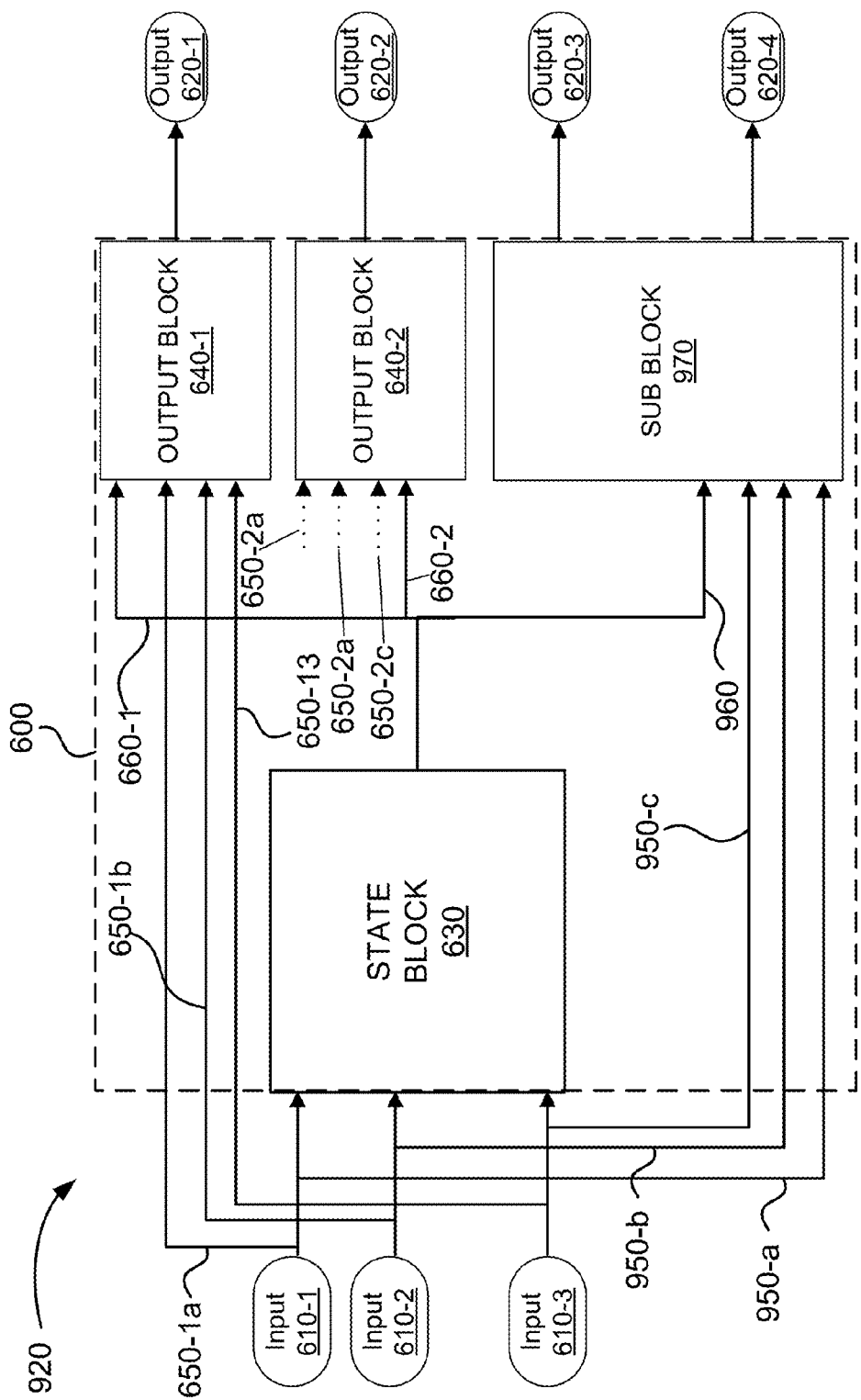

FIGS. 9A and 9B are example block diagrams 910 and 920 illustrating an example of creating and optimizing a group of sub blocks. Assume that, as shown in block diagram 910 of FIG. 9A, block 600 may receive input signals 610-1, 610-2, and 610-3 and provide output signals 620-1, 620-2, 620-3, and 640-4. Further assume that output signal 620-1 directly depends on input signal 610-1, that output signal 620-2 directly depends on input signal 610-2, that output signal 620-3 directly depends on input signal 610-3, that output signal 620-4 directly depends on input signal 610-3, and that no other one of output signals 620-1, 620-2, 620-3, and 620-4 directly depends on any other one of input signals 610-1, 610-2, and 610-3.

To avoid spurious algebraic loops when processing block 600, TCE 110 may represent block 600 with a group of sub blocks. As shown in block diagram 910, the group of sub blocks may include state block 630 and output blocks 640-1, 640-2, 640-3, and 640-4. State block 630 may provide a state. Each one of output blocks 640-1, 640-2, 640-3, and 640-4 may provide one of output signals 620-1, 620-2, 620-3, and 620-4, respectively.

TCE 110 may establish connections for the group of sub blocks. The connections may include input connections 650-1a, 650-2a, 650-3a, and 650-4a to provide input signal 610-1 to each one of output blocks 640-1, 640-2, 640-3, and 640-4, respectively. Further, the connections may include input connections 650-1b, 650-2b, 650-3b, and 650-4b to provide input signal 610-2 to each one of output blocks 640-1, 640-2, 640-3, and 640-4, respectively. Also, the connections may include input connections 650-1c, 650-2c, 650-3c, and 650-4c to provide input signal 610-3 to each one of output blocks 640-1, 640-2, 640-3, and 640-4, respectively. The connections may also include state connections 660-1, 660-2, 660-3, and 660-4 to provide the state (i.e., the output of state block 630) to each one of output blocks 640-1, 640-2, 640-3, and 640-4, respectively. TCE 110 may optimize the group of sub blocks after creating block diagram 910.

FIG. 9B illustrates an optimized block diagram 920 with the group of sub blocks optimized. After creating block diagram 910, TCE 110 may retrieve output equations associated with output blocks 640-1, 640-2, 640-3, and 640-4. TCE 100 may compute direct feedthrough information for block diagram 920 based on the output equations. The direct feedthrough information may indicate relationships between input signals 610 and output signals 620. For example, the direct feedthrough information may indicate that output signal 620-1 directly depends on input signal 610-1, that output signal 620-2 directly depends on input signal 610-2, that output signal 620-3 directly depends on input signal 610-3, and that output signal 620-4 directly depends on input signal 610-3. The direct feedthrough information may also indicate, for example, that no other one of output signals 620-1, 620-2, 620-3, and 620-4 directly depends on any other one of input signals 610-1, 610-2, and 610-3.

TCE 110 may determine which output blocks 640 to combine into a sub block 970 based on the direct feedthrough information. TCE 110 may identify two or more output blocks 640 that do not directly depend or directly depend on same ones of input signals 610. TCE 110 may combine the identified output blocks 640 into sub block 970.

In this example, as shown in block diagram 920, TCE 110 may combine output blocks 640-3 and 640-4, of block diagram 910, into sub block 970. Sub block 970 may provide output signals 620-3 and 620-4 based on a first output equation for providing output 620-3 and a second output equation for providing output 620-4, respectively. TCE 110 may establish new input connections 950-a, 950-b, and 950-c to provide each one of input signals 610-1, 610-2, and 610-3, respectively, to sub block 970. TCE 110 may also establish a new state connection 960 to provide the state from state block 630 to sub block 970. Sub block 970 may calculate output signals 620-3 and/or 620-4 based on input signal 610-1, input signal 610-2, input signal 610-3 and/or the state.

Example Process for Optimizing a Group of Sub Blocks

Figure 10:
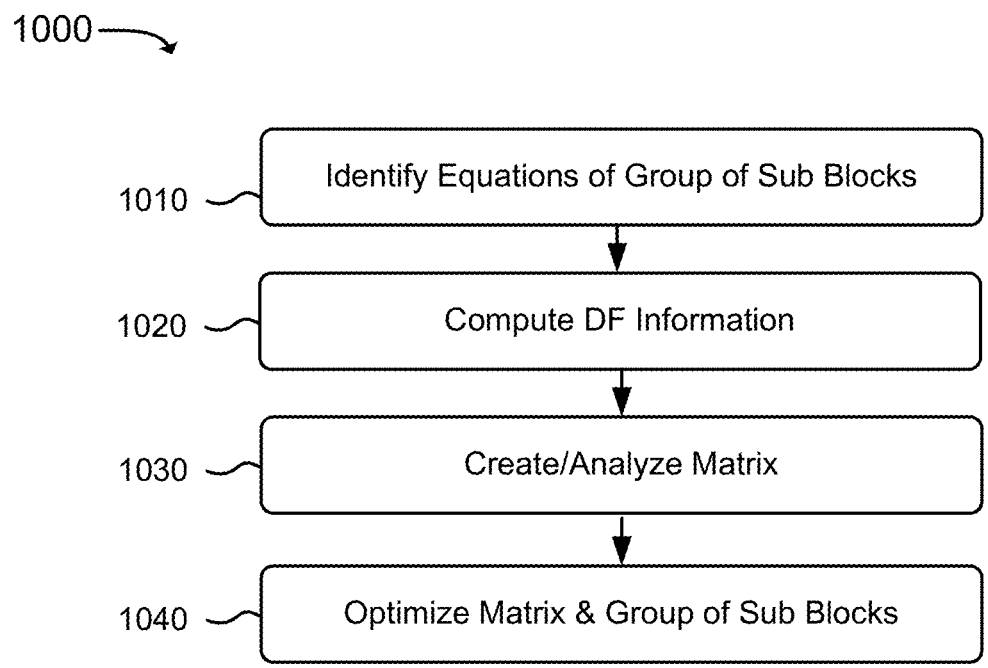
FIG. 10 is a flowchart of an example process for optimizing a group of sub blocks.

FIG. 10 is a flowchart of an example process 1000 for optimizing a group of sub blocks. Process 1000 may be performed by TCE 110. Process 1000 is described with reference to block diagrams 910 and 920 of FIGS. 9A and 9B and with reference to matrices 1110 and 1120 of FIG. 11.

As shown in FIG. 10, process 1000 may include identifying equations of a group of sub blocks (block 1010). For example, TCE 110 may create block diagram 910 for block 600. TCE 110 may identify equations associated with the group of sub blocks in block diagram 910. Specifically, TCE 110 may identify a state equation corresponding to state block 630, a first output equation corresponding to output block 640-1, a second output equation corresponding to output block 640-2, a third output equation corresponding to output block 640-3, and/or a fourth output equation corresponding to output block 640-4.

Process 1000 may further include computing direct feedthrough (DF) information (block 1020). For example, TCE 110 may determine, based on the identified equations, the DF information. As discussed above in reference to FIG. 9B, the DF information may indicate the relationships between input signals 610 and output signals 620. TCE 110 may use the DF information to specify whether each individual sub block, of the group of sub blocks, has direct feedthrough. For example, TCE 110 may set a flag that is associated with any output block 640 identified as having direct feedthrough. TCE 110 may provide the DF information to a compiler. The compiler may compile code based on the group of sub blocks and based on the DF information.

Figure 11:
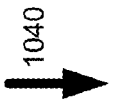
FIG. 11 illustrates example matrices that may be used for optimizing a group of sub blocks.

Process 1000 may also include creating and analyzing a matrix (block 1030). FIG. 11 illustrates an example matrix 1110 and an example optimized matrix 1120. TCE 110 may optimize the group of sub blocks by, first, creating optimized matrix 1120 based on matrix 1110.

For example, while (or after) computing the DF information, TCE 110 may create matrix 1110 based on the DF information. Matrix 1110 is an input-output wise direct feedthrough (DF) matrix. For example, matrix 1110 may include a first row that corresponds to input signal 610-1, a second row that corresponds to input signal 610-2, and a third row that corresponds to input signal 610-3. Matrix 1110 may also include a first column that corresponds to output signal 620-1, a second column that corresponds to output signal 620-2, a third column that corresponds to output signal 620-3, and a fourth column that corresponds to output signal 620-4. In other implementations, TCE 110 may configure and/or present matrix 1110 (and/or matrix 1120) in a variety of alternative ways. For example, the columns of matrix 1110 may correspond to input signals 610 and the rows of matrix 1110 may correspond to output signals 620. In yet other implementations, TCE 110 may organize information of matrix 1110 and/or matrix 1120 in matrices that include three or more dimensions.

TCE 110 may determine (e.g., based on the DF information) what output signals 620 directly depend on what input signals 610. TCE 110 may fill out matrix 1110 based on the determination(s). For example, TCE 110 may add a "1" at the intersection of the first row and the first column of matrix 1110 to indicate that output signal 620-1 directly depends on input signal 610-1. The "1" may indicate that direct feedthrough exists between input signal 610-1 and output signal 620-1. TCE 110 may further add a "1" at the intersection of the second row and the second column of matrix 1110 to indicate that direct feedthrough exists between input signal 610-2 and output signal 620-2. TCE 110 may also add a "1" at the intersection of the third row and the third column of matrix 1110 to indicate that direct feedthrough exists between input signal 610-3 and output signal 620-3. TCE 110 may also add a "1" at the intersection of the third row and the fourth column of matrix 1110 to indicate that direct feedthrough exists between input signal 610-3 and output signal 620-4. TCE 110 may also add "0"s at other intersections of matrix 1110 to indicate that direct feedthrough does not exist between a particular input signal 610 and a particular output signal 620.

Process 1000 may also include optimizing a matrix and a group of sub blocks (block 1040). For example, TCE 110 may determine how to optimize the group of sub blocks in block diagram 910 based on matrix 1110. To do so, TCE 110 may determine whether one or more columns, corresponding to outputs 620, of matrix 1110 include equivalent values. TCE 110 may determine that the third column (corresponding to output 620-3) and the fourth column (corresponding to output 620-4) have equivalent values of "0" for every input. As a result, TCE 110 may combine the third column and the fourth column of matrix 1110 into a new column to create optimized matrix 1120. The new column of optimized matrix 1120 may correspond to sub block 970 of block diagram 920. Accordingly, TCE 110 may create optimized block diagram 920 of FIG. 9B by combining, based on matrix 1110 and/or optimized matrix 1120, output blocks 620-3 and 620-4 into sub block 970.

Thereafter, TCE 110 may establish new input connections 950-a, 950-b, and 950-c to provide each one of input signals 610-1, 610-2, and 610-3, respectively, to sub block 970. TCE 110 may also establish a new state connection 960 to provide the state from state block 630 to sub block 970.

After creating optimized block diagram 920, TCE 110 may represent block 600 (from block diagram 910) by using optimized block diagram 920. For example, TCE 110 may compile and execute state block 630, output block 640-1, output block 640-2, and sub block 670 instead of compiling and executing block 600 from block diagram 910.

In another implementation, TCE 110 may allow a user to optimize the group of sub blocks. TCE 110 may allow the user to select two or more output blocks 640 to combine into sub block 970. TCE 110 may create sub block 970 based on the selected two or more output blocks 640. TCE 110 may replace, in the group of sub blocks, the selected two or more output blocks 640 with sub block 970.

Example Process for Optimizing Processing of Equations

Figure 12:
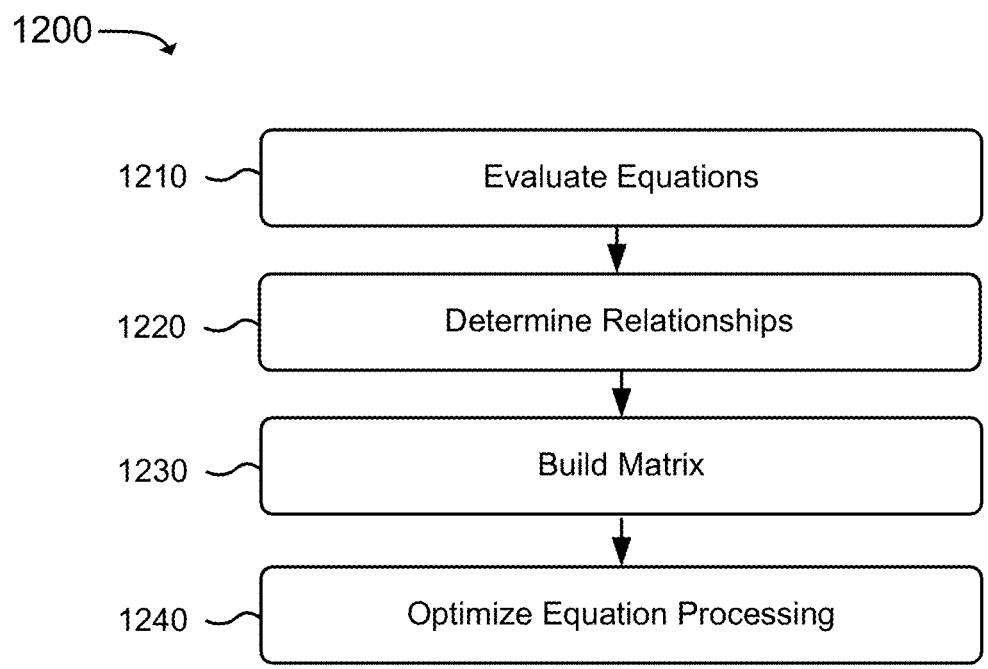
FIG. 12 is a flowchart of an example process for optimizing processing of equations.

FIG. 12 is a flowchart of an example process 1200 for optimizing processing of equations. User device 105 may perform process 1200. In one implementation, a user may use a textual-based environment to enter code that includes equations. In another implementation, TCE 110 may generate code based on a model created in a graphical-based environment. The generated code may include equations. User device 105 may execute process 1200 to optimize processing of the equations in the code.

As shown in FIG. 12, process 1200 may include evaluating equations (block 1210). For example, user device 105 may identify equations in a segment of code corresponding to a function. User device 105 may evaluate the equations to identify equation inputs (e.g., analogous to input signals 610-1, 610-2, and 610-3) and equation outputs (e.g., analogous to output signals 620-1, 620-2, 620-3, and 620-4).

Process 1200 may further include determining relationships (block 1220). For example, user device 105 may determine, based on the equations, relationships between the equation inputs and the equation outputs. Specifically, user device 105 may determine direct dependencies between the equation inputs and the equation outputs. If, for example, the first equation output directly depends on the first equation input, then a direct feedthrough relationship exists between the first equation output and the first equation input. Determining relationships may include building a matrix and optimizing the matrix, as described further below.

Process 1200 may also include building a matrix (block 1230). For example, assume that a direct feedthrough relationship exists between the first equation input (e.g., input signal 610-1) and the first equation output (e.g., output signal 620-1) (i.e., output signal 620-1 directly depends on input signal 610-1). Also, assume that a direct feedthrough relationship exists between the second equation input (e.g., input signal 610-2) and the second equation output (e.g., output signal 620-2). User device 105 may build matrix 1110 (of FIG. 11) for the equations, which include input signals 610-1, 610-2, and 610-3 as the equation inputs and output signals 620-1, 620-2, 620-3, and 620-4 as the equation outputs. Matrix 1110 may represent the determined relationships between the equation inputs and the equation outputs for the example described above.

Process 1200 may also include optimizing equation processing (block 1240). For example, user device 105 may determine how to optimize the processing of the equations based on matrix 1110. To do so, user device 105 may determine what two or more columns, corresponding to the equations outputs, have equivalent values. For matrix 1110, user device 105 may determine that a third column of matrix 1110, which corresponds to output signal 620-3, and a fourth column of matrix 1110, which corresponds to output 620-4, have equivalent values. As a result, user device 105 may determine that the processing of the output equations (e.g., the third output equation and the fourth output equation) associated with output signal 620-3 and output signal 620-4 may be combined. Thus, when executing the code that includes the equations, user device 105 may combine the processing of the third output equation and the fourth output equation.

Example Distributed Network

Figure 13:
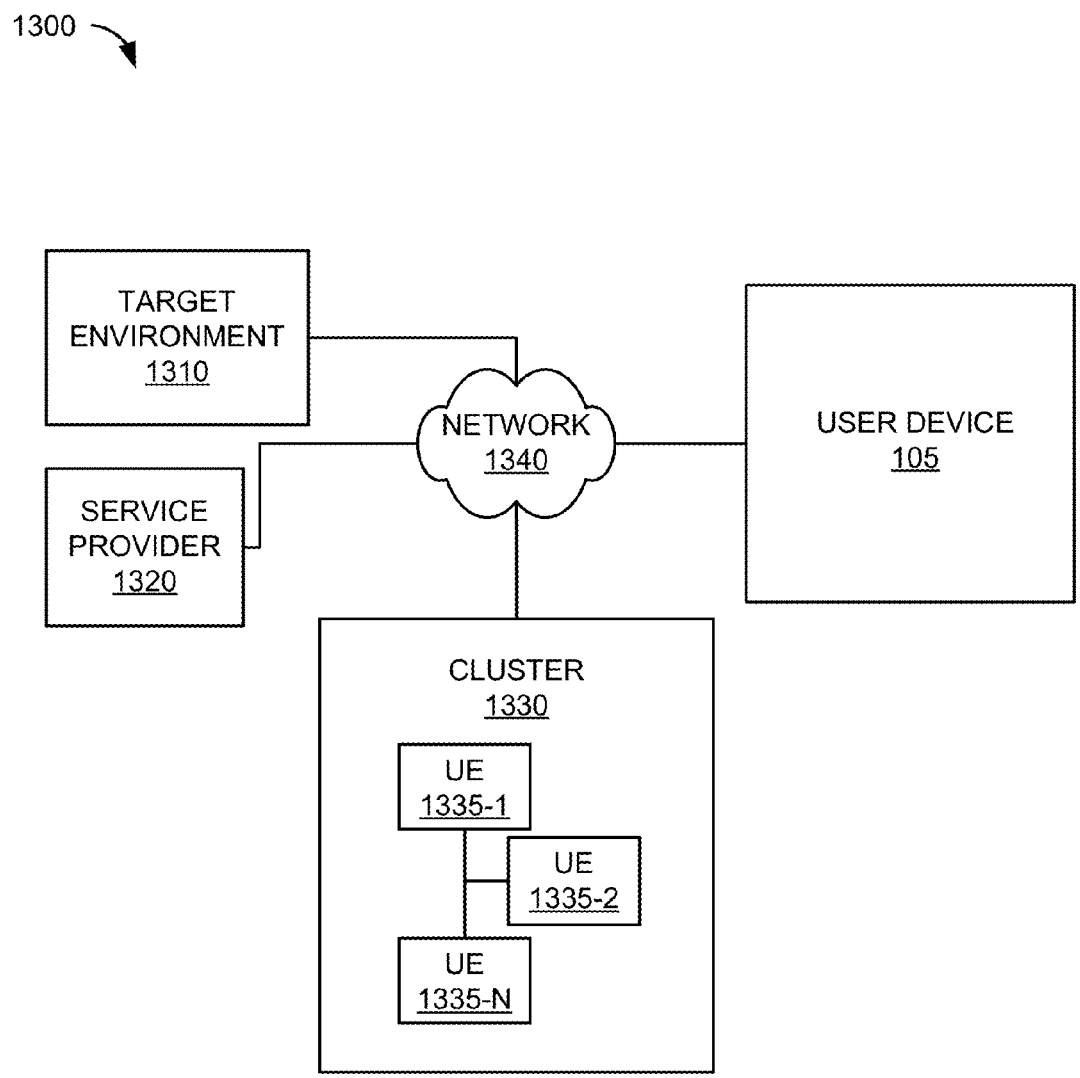
FIG. 13 is a diagram of an example distributed network in which systems and/or methods described herein may be implemented.

FIG. 13 illustrates an example of a distributed network 1300 in which systems and/or methods described herein may be implemented. Referring to FIG. 13, environment 1300 may contain various entities including user device 105, target environment 1310, service provider 1320, cluster 1330, and network 1340. Note that the distributed environment 1300 is just one example of a distributed environment that may be used with embodiments described herein. Other distributed environments that may be used may contain more entities, fewer entities, entities in arrangements that differ from the arrangement illustrated in FIG. 13, and so on. Moreover, the distributed environments may be configured to implement various "cloud computing" frameworks.

Details of user device 105 were described above with respect to FIG. 1. In distributed environment 1300, user device 105 may be configured to, among other things, exchange information (e.g., data) with other entities in network 1340 (e.g., target environment 1310, service provider 1320, and cluster 1330). User device 105 may interface with network 1340 via communication interface 270.

Target environment 1310 may be configured to execute and/or interpret a compiled version of a model, such as model 410, which may be generated in or otherwise available to the distributed environment 1300. Network 1340 may include a communication network capable of exchanging information between the entities in the network 1340. Network 1340 may include digital and/or analog aspects. The information may include machine-readable information having a format that may be adapted for use, for example, in network 1340 and/or with one or more entities in network 1340. For example, the information may be encapsulated in one or more packets that may be used to transfer the information through network 1340.

Information may be exchanged between entities using various network protocols, such as, but not limited to, the Internet Protocol (IP), Asynchronous Transfer Mode (ATM), Synchronous Optical Network (SONET), the User Datagram Protocol (UDP), Transmission Control Protocol (TCP), Institute of Electrical and Electronics Engineers (IEEE) 802.11, etc.

Network 1340 may comprise various network devices, such as gateways, routers, switches, firewalls, servers, repeaters, address translators, etc. Portions of network 1340 may be wired (e.g., using wired conductors, optical fibers, etc.) and/or wireless (e.g., using free-space optical (FSO), radio frequency (RF), acoustic transmission paths, etc.). Portions of network 1340 may include a substantially open public network, such as the Internet. Portions of network 1340 may include a more restricted network, such as a private corporate network or virtual private network (VPN). It should be noted that implementations of networks and/or devices operating on networks described herein are not limited with regards to, for example, information carried by the networks, protocols used in the networks, and/or the architecture/configuration of the networks.

Service provider 1320 may include logic that makes a service available to another entity in distributed environment 1300. Service provider 1320 may also include a server operated by, for example, an individual, a corporation, an educational institution, a government agency, and so on, that provides one or more services to a destination, such as user device 105. The services may include software containing computer-executable instructions that implement one or more embodiments of the invention or portions thereof, and may be executed, in whole or in part, by (1) a destination, (2) the service provider 1320 on behalf of the destination, or (3) some combination thereof.

For example, in an embodiment, service provider 1320 may provide one or more subscription-based services that may be available to various customers. The services may be accessed by a customer via network 1340. The customer may access the services using a computer system, such as user device 105. The services may include services that implement one or more embodiments of the invention or portions thereof. Service provider 1320 may limit access to certain services based on, for example, a customer service agreement between the customer and service provider 1320.

The service agreement may allow the customer to access the services that may allow the customer to build, execute, and/or analyze a model, such as model 410, as described above. The service agreement may include other types of arrangements, such as certain fee-based arrangements or restricted access arrangements. For example, a customer may pay a fee which provides the customer unlimited access to a given package of services for a given time period (e.g., per minute, hourly, daily, monthly, yearly, etc.). For services not included in the package, the customer may have to pay an additional fee to access the services. Still other arrangements may be resource-usage based. For example, the customer may be assessed a fee based on an amount of computing resources and/or network bandwidth used.

Cluster 1330 may include a number of units of execution (UEs) 1332 that may perform processing of one or more embodiments of the invention or portions thereof on behalf of user device 105 and/or another entity, such as service provider 1320. The UEs 1332 may reside on a single device or chip or on multiple devices or chips. For example, the UEs 1332 may be implemented in a single ASIC or in multiple ASICs. Likewise, the UEs 1332 may be implemented in a single computer system or multiple computer systems. Other examples of UEs 1332 may include FPGAs, CPLDs, ASIPs, processors, multiprocessor systems-on-chip (MPSoCs), graphic processing units, microprocessors, etc. UEs 1332 may be configured to perform operations on behalf of another entity. For example, in an embodiment, UEs 1332 are configured to execute portions of code associated with TCE 110. Here, TCE 110 may dispatch certain activities pertaining to one or more embodiments of the invention to UEs 1332 for execution. Service provider 1320 may configure cluster 1330 to provide, for example, the above-described services to user device 105 on a subscription basis (e.g., via a web service).

CONCLUSION

The foregoing description of implementations provides illustration and description, but is not intended to be exhaustive or to limit the invention to the precise form disclosed. Modifications and variations are possible in light of the above teachings or may be acquired from practice of the invention.

For example, while series of blocks have been described with regard to processes of FIGS. 7, 10, and 12, the order of the blocks may be modified in other implementations. Further, non-dependent blocks may be performed in parallel.

Also, the term "user" has been used herein. The term "user" is intended to be broadly interpreted to include, for example, a device or a user of a device.

It will be apparent that example aspects, as described above, may be implemented in many different forms of software, firmware, and hardware in the embodiments illustrated in the figures. The actual software code or specialized control hardware used to implement these aspects should not be construed as limiting. Thus, the operation and behavior of the aspects were described without reference to the specific software code—it being understood that software and control hardware could be designed to implement the aspects based on the description herein.

Further, certain portions, described herein, may be implemented as "logic" that performs one or more functions. This logic may include hardware, such as an application specific integrated circuit or a field programmable gate array, software, or a combination of hardware and software.

Even though particular combinations of features are recited in the claims and/or disclosed in the specification, these combinations are not intended to limit the disclosure of the invention. In fact, many of these features may be combined in ways not specifically recited in the claims and/or disclosed in the specification. Although each dependent claim listed below may directly depend on only one other claim, the disclosure of the invention includes each dependent claim in combination with every other claim in the claim set.

No element, act, or instruction used in the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. One or more non-transitory computer-readable media storing instructions, the instructions comprising:
one or more instructions that, when executed by a processor, cause the processor to:
identify a block of a model,
the block including:
an input signal, and
two or more output signals;
represent the block as a group of sub blocks,
the group of sub blocks including:
a state block that provides a state, and
two or more output blocks for receiving the state;
establish connections for the group of sub blocks;
determine relationships between the input signal and the two or more output signals;
optimize the group of sub blocks based on the relationships; and
represent the block using the group of sub blocks in the model.

2. The one or more non-transitory computer-readable media of claim 1, where the instructions further comprise:
one or more instructions that, when executed by the processor, cause the processor to:
identify equations corresponding to the group of sub blocks;
compute direct feedthrough information for the group of sub blocks based on the equations; and
provide the direct feedthrough information to a compiler.

3. The one or more non-transitory computer-readable media of claim 1, where the one or more instructions to determine the relationships comprise:
one or more instructions that, when executed by the processor, cause the processor to:
construct a matrix based on the input signal and the two or more output signals;
determine that two or more columns of the matrix include equivalent values,
each one of the two or more columns corresponding to one of the two or more output blocks; and
combine the two or more columns into a single new column based on determining that the two or more columns include equivalent values.

4. The one or more non-transitory computer-readable media of claim 1, where the one or more instructions to optimize the group of sub blocks comprise:
one or more instructions that, when executed by the processor, cause the processor to:
combine output blocks of the two or more output blocks into a single sub block.

5. The one or more non-transitory computer-readable media of claim 1, where the two or more output blocks correspond to the two or more output signals of the block.

6. The one or more non-transitory computer-readable media of claim 1, where the instructions further comprise:
one or more instructions that, when executed by the processor, cause the processor to:
compile and execute the group of sub blocks instead of the block.

7. The one or more non-transitory computer-readable media of claim 1, where each one of the input signal and the output signals is one of a scalar or a vector.

8. A method comprising:
evaluating equations associated with a function,
evaluating the equations being performed by a computer device;
determining relationships between inputs and outputs of the equations,
the determining being performed by the computer device;
creating a matrix for the equations based on the relationships,
the matrix representing the relationships between the inputs and the outputs, and
creating the matrix being performed by the computer device;
determining whether first values in the matrix, corresponding to a first output of the outputs, and second values in the matrix, corresponding to a second output of the outputs, are equivalent,
determining whether the first values and the second values are equivalent being performed by the computer device; and
combining processing of two or more of the equations associated with the first output and the second output when the first values and the second values are equivalent,
combining the processing of the two or more of the equations when the first values and the second values are equivalent being performed by the computer device.

9. The method of claim 8, where the equations comprise:
a first output equation corresponding to the first output,
a second output equation corresponding to the second output,
a third output equation corresponding to a third output of the outputs, and
a state equation for providing a state for two or more of the first output equation, the second output equation, or the third output equation.

10. The method of claim 8, where the relationships include:
a first direct feedthrough relationship between a first input, of the inputs, and the first output, and
a second direct feedthrough relationship between a second input, of the inputs, and the second output.

11. A system comprising:
a memory to store instructions; and
a processor to execute the instructions to:
receive a model,
the model including a block with an input signal and two or more output signals, and
the two or more output signals including a first output signal and a second output signal;
determine that the block has direct feedthrough; and
represent the block using a group of sub blocks based on determining that the block has direct feedthrough,
the group of sub blocks including a first output block, a second output block, and a state block,
the first output block providing the first output signal,
the second output block providing the second output signal, and
the state block providing a state to at least one of the first output block or the second output block.

12. The system of claim 11, where, when determining that the block has direct feedthrough, the processor is to:
determine that a direct feedthrough flag of the block indicates that the block has direct feedthrough,
the direct feedthrough flag being set by a creator of the model or based on an analysis of equations associated with the block; and
determine that the block has direct feedthrough based on determining that the direct feedthrough flag of the block indicates that the block has direct feedthrough.

13. The system of claim 11, where the state block provides only the state to the first output block and the second output block.

14. The system of claim 11,
where the processor is further to:
connect the group of sub blocks with connections, and
where the connections comprise:
input connections between the input signal and the first output block, the second output block, and the state block, and
state connections between the state block and the first output block and the second output block.

15. A method comprising:
representing a block, of a model, as a group of sub blocks,
the group of sub blocks including a state block, a first output block, a second output block, and a third output block,
the first output block corresponding to a first output signal of the block,
the second output block corresponding to a second output signal of the block,
the third output block corresponding to a third output signal of the block,
the state block providing a state to the first output block and the second output block, and
representing the block being performed by a computer device;
establishing input connections from an input signal of the block to the first output block, the second output block, and the state block,
establishing the input connections being performed by the computer device;
establishing state connections from the state block to the first output block and the second output block,
establishing the state connections being performed by the computer device;
determining that an optimizing condition is met,
the optimizing condition being met when direct feedthrough does not exist between the input signal and the second output signal and does not exist between the input signal and the third output signal, and
determining that the optimizing condition is met being performed by the computer device; and
replacing the second output block and the third output block with a single sub block based on determining that the optimizing condition is met,
replacing the second output block and the third output block being performed by the computer device.

16. The method of claim 15,
where the first output block provides the first output signal, and
where the second output block provides the second output signal.

17. The method of claim 15, where direct feedthrough exists between an input signal of the block and the first output signal.

18. A non-transitory computer-readable storage medium storing instructions, the instructions comprising:
one or more instructions that, when executed by a processor, cause the processor to:
determine that a block, of a model, has direct feedthrough,
where
the block including:
an input, and
two or more outputs; and
automatically replace the block, in the model, with three or more sub blocks based on determining that the block has direct feedthrough,
the two or more outputs corresponding to at least two of the three or more sub blocks.

19. The non-transitory computer-readable storage medium of claim 18, where the three or more sub blocks include:
a first output block that provides a first output of the two or more outputs,
a second output block that provides a second output of the two or more outputs, and
a state block that provides a state to at least one of the first output block and the second output block.

20. The non-transitory computer-readable storage medium of claim 18, where the instructions further comprise:
one or more instructions that, when executed by the processor, cause the processor to:
establish connections between the input and the three or more sub blocks.

21. The non-transitory computer-readable storage medium of claim 18, where the one or more instructions to determine that the block has direct feedthrough comprise:
one or more instructions that, when executed by the processor, cause the processor to:
determine that the block has direct feedthrough based on information provided by a creator of the model or based on an analysis of equations associated with the block.

* * * * *

UNITED STATES PATENT AND TRADEMARK OFFICE
CERTIFICATE OF CORRECTION

| | |
|---|---|
| PATENT NO. | : 8,849,641 B1 |
| APPLICATION NO. | : 13/041900 |
| DATED | : September 30, 2014 |
| INVENTOR(S) | : Mohamed Babaali |

It is certified that error appears in the above-identified patent and that said Letters Patent is hereby corrected as shown below:

Claims

Please correct Claim 18 as follows:

Column 21, line 15, delete "where".

Signed and Sealed this
Fourth Day of August, 2015

Michelle K. Lee
*Director of the United States Patent and Trademark Office*